(12) United States Patent
Wang et al.

(10) Patent No.: US 11,166,374 B2
(45) Date of Patent: Nov. 2, 2021

(54) CONNECTION PLATE, CIRCUIT BOARD ASSEMBLY, AND ELECTRONIC DEVICE

(71) Applicant: HUAWEI TECHNOLOGIES CO., LTD., Guangdong (CN)

(72) Inventors: Hui Wang, Shanghai (CN); Dan Qiu, Shanghai (CN); Zhijun Chen, Shanghai (CN); Daiping Tang, Shanghai (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 16/980,174

(22) PCT Filed: Mar. 15, 2018

(86) PCT No.: PCT/CN2018/079178
§ 371 (c)(1),
(2) Date: Sep. 11, 2020

(87) PCT Pub. No.: WO2019/174007
PCT Pub. Date: Sep. 19, 2019

(65) Prior Publication Data
US 2021/0014971 A1  Jan. 14, 2021

(51) Int. Cl.
*H05K 1/14* (2006.01)
*H05K 1/11* (2006.01)
*H05K 5/00* (2006.01)

(52) U.S. Cl.
CPC ............. *H05K 1/144* (2013.01); *H05K 1/115* (2013.01); *H05K 5/0017* (2013.01); *H05K 2201/042* (2013.01); *H05K 2201/10128* (2013.01)

(58) Field of Classification Search
CPC ...... H05K 1/144; H05K 1/115; H05K 5/0017; H05K 2201/042; H05K 2201/09854;
(Continued)

(56) References Cited

U.S. PATENT DOCUMENTS

| 4,054,939 A | 10/1977 | Ammon |
| 2002/0139578 A1 | 10/2002 | Alcoe et al. |

(Continued)

FOREIGN PATENT DOCUMENTS

| CN | 103260335 A | 8/2013 |
| CN | 104638463 A | 5/2015 |

(Continued)

*Primary Examiner* — Sherman Ng
(74) *Attorney, Agent, or Firm* — Womble Bond Dickinson (US) LLP

(57) ABSTRACT

An electronic device includes a first circuit board, a second circuit board stacked with the first circuit board, and a connection plate connected between the first circuit board and the second circuit board. The connection plate includes a signal transmission part and at least one ground part at a spacing to the signal transmission part. The ground part can be used as a reference ground for a signal transmitted by the signal transmission part, so that the characteristic impedance of the signal transmission part is controllable, and the signal transmitted by the signal transmission part has strong continuity, thereby maintaining good matching performance and reducing an insertion loss caused by characteristic impedance mismatch.

20 Claims, 16 Drawing Sheets

(58) Field of Classification Search
CPC . H05K 2201/10378; H05K 2201/2036; H05K 2201/09809; H05K 1/0219
USPC ........................................................ 361/758
See application file for complete search history.

(56) References Cited

U.S. PATENT DOCUMENTS

| | | | |
|---|---|---|---|
| 2008/0191956 A1* | 8/2008 | Watanabe | ............... H01Q 23/00 343/841 |
| 2010/0255690 A1 | 10/2010 | Waite et al. | |
| 2012/0243195 A1* | 9/2012 | Lim | ....................... H05K 1/141 361/784 |
| 2015/0022986 A1 | 1/2015 | Steuer et al. | |

FOREIGN PATENT DOCUMENTS

| | | |
|---|---|---|
| CN | 104752904 A | 7/2015 |
| CN | 204597019 U | 8/2015 |
| CN | 105682343 A | 6/2016 |
| EP | 0243021 A1 | 10/1987 |
| EP | 1182913 A1 | 2/2002 |

* cited by examiner

CONNECTION PLATE, CIRCUIT BOARD ASSEMBLY, AND ELECTRONIC DEVICE

CROSS-REFERENCE TO RELATED APPLICATIONS

This application is a national stage of International Application No. PCT/CN2018/079178, filed on Mar. 15, 2018. The disclosure of the aforementioned application is hereby incorporated by reference in its entirety.

TECHNICAL FIELD

The application relates to the field of electronic products, and in particular, to a connection plate, a circuit board assembly, and an electronic device.

BACKGROUND

With development of technologies, consumers have increasingly high requirements for electronic products, research and development personnel have increasingly strong design requirements for a miniaturized printed circuit board (PCB), and a system architecture with a multilayer printed circuit board stacking design is more popular among the research and development personnel.

Such a printed circuit board architecture brings not only a benefit from miniaturization but also some new problems. In these problems, how to resolve a problem of a signal connection, especially a radio frequency signal connection, between different printed circuit boards is crucial. A connection plate is used to connect two of a plurality of layers of printed circuit boards, and a wire in the connection plate is used to transmit a signal between the two printed circuit boards. However, characteristic impedance of a wire in a conventional connection plate structure cannot be controlled, resulting in discontinuous signal transmission. Consequently, there is a great insertion loss during signal transmission. In addition, a Smith chart is relatively divergent, and is difficult to debug and converge.

SUMMARY

The application provides a connection plate, a circuit board assembly, and an electronic device that can precisely control characteristic impedance.

In an embodiment, the application provides a connection plate, where the connection plate is configured to connect in between two circuit boards, to implement an electrical connection between the two circuit boards, the connection plate includes a plate body, a signal transmission part, and a ground part, a signal transmission hole and at least one ground hole are disposed on the plate body, the signal transmission hole extends from one end of the plate body to the other end of the plate body, the signal transmission part is disposed in the signal transmission hole, the signal transmission part can transmit a radio frequency signal between the two circuit boards, the at least one ground hole extends from one end of the plate body to the other end of the plate body, and has a same extension path as the signal transmission hole, the at least one ground hole surrounds the signal transmission hole and is disposed with a spacing between the at least one ground hole and the signal transmission hole, the ground part is disposed in the at least one ground hole, and the ground part can be connected to ground of each of the two circuit boards, to implement continuity of grounding between each of the two circuit boards and the connection plate.

In the embodiment, the at least one ground hole surrounds the signal transmission hole and is disposed with a spacing between the at least one ground hole and the signal transmission hole, the ground part is disposed in the at least one ground hole, and the signal transmission part is disposed in the signal transmission hole, so that the ground part surrounds the signal transmission part and is disposed with a spacing between the ground part and the signal transmission part. The ground part can be used as a reference ground for a signal transmitted by the signal transmission part, so that characteristic impedance of the signal transmission part can be controlled by adjusting a radius of the signal transmission part (which is referred to as an inner radius below) and a radius of a circle contour that is tangent to each ground part and that is between the signal transmission part and the ground part (which is referred to as an outer radius below). In this way, the characteristic impedance of the signal transmission part is controllable, and the signal transmitted by the signal transmission part has strong continuity, thereby maintaining good matching performance and reducing an insertion loss caused by characteristic impedance mismatch. Therefore, an insertion loss of the signal transmitted by the signal transmission part is relatively small, and a Smith chart is relatively converged. The at least one ground hole and the signal transmission hole have the same extension path, in other words, the extension path of the ground part is the same as the extension path of the signal transmission part, so that the characteristic impedance of the signal transmission part is more controllable. The ground part can further shield signal radiation. Therefore, even if the signal transmission part equivalently is used as a short antenna, when the signal is transmitted by the signal transmission part, the ground part can effectively reduce radiation of the signal transmitted by the signal transmission part, and reduce interference caused by another signal for the signal transmitted by the signal transmission part, so that overall performance of the signal transmitted by the signal transmission part is relatively good.

When another condition remains unchanged, the characteristic impedance of the signal transmission part increases with an increase of the outer radius. When another condition remains unchanged, the characteristic impedance of the signal transmission part decreases with an increase of the inner radius.

In an embodiment, there are at least two ground holes, a distance between adjacent ground holes is d, the distance d is a minimum distance between the adjacent ground holes, and the distance d meets the following condition: $d \leq \lambda/n$; the signal transmission part is configured to transmit a signal whose highest frequency is f; and $\lambda$, is a wavelength corresponding to the highest frequency f, and $n \geq 4$.

In an embodiment, the distance between the adjacent ground holes is very small, is filled in the ground part in all the ground holes, and is equivalent to a closed ring-shaped ground part, so that a characteristic impedance control effect and a shielding effect of the ground part on the signal transmission part can be ensured. It may be understood that a smaller distance between the adjacent ground holes indicates a better characteristic impedance control effect and a better shielding effect of the ground part.

In an embodiment, n=10. In this case, the connection plate can better balance a quantity of the ground holes and each of the characteristic impedance control effect and the shielding effect of the ground part, so that the connection plate has low costs and high reliability.

In an embodiment, all the ground holes are arranged with an equal distance therebetween in a circumference direction of the signal transmission hole. In this case, the distance between the adjacent ground holes is equal, so that a characteristic impedance control effect and a shielding effect of the ground part are better, and a preparation process of the ground part is simpler and more reliable, thereby reducing a defective ratio of the connection plate.

In an embodiment, spacings between all the ground holes and the signal transmission hole are equal. In this case, a center of the circle contour that is tangent to each ground part and that is between the signal transmission part and the ground part overlaps a center of the signal transmission hole. Each of the ground holes is in contact with the circle contour, and all the ground holes can perform both characteristic impedance control and shielding, so that the characteristic impedance of the signal transmission part is more precise controlled, and a radiation shielding effect is better.

In an embodiment, a cross-sectional shape of the ground hole is the same as a cross-sectional shape of the signal transmission hole. In this case, all the ground holes and the signal transmission hole may be processed by using a same jig, so that processing difficulty and costs of the connection plate are relatively low. Certainly, it also helps to set the inner radius and the outer radius based on required characteristic impedance.

In an embodiment, the cross-sectional shape of the signal transmission hole is a circle, an ellipse, or a polygon. The polygon includes but is not limited to a triangular shape, a quadrilateral (for example, a square or a rhomb), a pentagon, a hexagon, or the like.

In an embodiment, a cross-sectional shape of the signal transmission hole is a circle, a cross-sectional shape of the ground hole is a sector, the cross-sectional shape of the ground hole includes an inner arc edge and an outer arc edge that are opposite to each other, and the signal transmission hole is located on a side that is of the inner arc edge and that is away from the outer arc edge. Relative edges of adjacent sectors are parallel to each other, so that a gap between adjacent ground holes can be narrowed, and a risk that the radiation of the signal transmitted by the signal transmission part passes through the ground part can be reduced.

In an embodiment, a cross-sectional shape of the signal transmission hole is a circle, there are four ground holes, a cross-sectional shape of each ground hole includes a first area and a second area, the first area is perpendicularly connected to the second area, the cross-sectional shape of the ground hole includes an inner side edge and an outer side edge that are opposite to each other, and the signal transmission hole is located on a side that is of the inner side edge and that is away from the outer side edge. Relative edges of the first area and the second area that are adjacent and not connected are parallel to each other, so that a gap between adjacent ground holes can be narrowed, and a risk that the radiation of the signal transmitted by the signal transmission part passes through the ground part can be reduced.

In an embodiment, there is one ground hole, and a cross-sectional shape of the ground hole is a closed ring. In this case, a characteristic impedance control function and a shielding function of the ground part are more reliable, and the signal transmitted by the signal transmission part cannot radiate outwards by bypassing the ground part.

In an embodiment, a cross-sectional shape of the signal transmission hole is a circle, and the cross-sectional shape of the ground hole is a circular ring, an elliptical ring, or a polygon ring. The polygon ring includes but is not limited to a trilateral ring, a quadrilateral ring (for example, a square ring, a rectangular ring, or a rhombic ring), a pentagon ring, a hexagon ring, or the like.

In an embodiment, a material used by the ground part is the same as a material used by the signal transmission part. In this case, characteristic impedance of the signal transmission part is more easily calculated, designed, and adjusted.

In an embodiment, connection holes are further disposed on the plate body, and the connection holes are located on a side that is of the at least one ground hole and that is away from the signal transmission hole; and the connection plate further includes connection parts, the connection parts are disposed in the connection holes, the connection parts and the signal transmission part are configured to transmit different signals, and the connection parts may be configured to transmit a power signal, a ground signal, or another signal.

In an embodiment, the connection holes are located on the side that is of the at least one ground hole and that is away from the signal transmission hole, so that the connection parts are disposed on a side that is of the ground part and that is away from the signal transmission part, disposition of the connection parts does not cause adverse impact on the signal transmitted by the signal transmission part, and the connection plate can transmit another signal that does not have a high requirement for characteristic impedance while ensuring quality of the signal transmitted by the signal transmission part. Therefore, an integration level of the connection plate is high.

In an embodiment, the connection parts include a first connection part and a second connection part, there are at least two connection holes, the first connection part and the second connection part are disposed in different connection holes, and the first connection part and the second connection part are configured to transmit different signals. In this case, the integration level of the connection plate is further improved.

The cross-sectional shape of the connection hole is the same as the cross-sectional shape of the signal transmission hole. In this case, a process difficulty of the connection plate is relatively low, and processing costs are relatively low.

In an embodiment, the application provides a circuit board assembly, where the circuit board assembly includes a first circuit board, a second circuit board, and the foregoing connection plate, the connection plate is connected between the first circuit board and the second circuit board, the signal transmission part is configured to transmit a signal between the first circuit board and the second circuit board, and the ground part is configured to connect ground of the first circuit board and ground of the second circuit board.

In the embodiment, because the connection plate is connected between the first circuit board and the second circuit board, and characteristic impedance of the signal transmission part on the connection plate is controllable, the circuit board assembly is relatively easy to precisely control characteristic impedance.

In an embodiment, the first circuit board and the second circuit board are stacked. In this case, the circuit board assembly includes a multilayer circuit board stacking architecture, and can be widely applied to various electronic devices. A first welding area is disposed on a side that is of the first circuit board and that faces the second circuit board. A second welding area is disposed on a side that is of the second circuit board and that faces the first circuit board. One end of the plate body abuts against the first welding area. The other end of the plate body abuts against the second welding area. The end of the plate body is fixedly connected to the first welding area in a welding manner (for example, coated with a tin soldering layer), to implement structural connection and electrical connection. The other end of the plate body is fixedly connected to the second welding area in a welding manner (for example, coated with a tin soldering layer), to implement structural connection and electrical connection. The connection plate is a bar plate, so that continuity of characteristic impedance of a signal transmitted by the signal transmission part is relatively great.

In an embodiment, a first signal transmission pad and at least one first ground pad are disposed in the first welding area, where the at least one first ground pad surrounds the first signal transmission pad and is disposed at with a spacing between the at least one first ground pad and the first signal transmission pad, a shape of the first signal transmission pad is the same as a cross-sectional shape of the first signal transmission hole, the shape of the first signal transmission pad changes with the cross-sectional shape of the first signal transmission hole, the first signal transmission pad and the first signal transmission hole overlap to implement continuity of characteristic impedance during signal transmission, a shape of the at least one first ground pad is the same as a cross-sectional shape of the at least one ground hole, the shape of the at least one first ground pad changes with the cross-sectional shape of the at least one ground hole, and the at least one first ground pad and the at least one ground hole overlap to implement continuity of characteristic impedance during signal transmission.

A second signal transmission pad and at least one second ground pad are disposed in the second welding area, where the at least one second ground pad surrounds the second signal transmission pad and is disposed with a spacing between the at least one second ground pad and the second signal transmission pad, a shape of the second signal transmission pad is the same as a cross-sectional shape of the first signal transmission hole, and a shape of the at least one second ground pad is the same as a cross-sectional shape of the at least one ground hole.

The circuit board assembly further includes two welding layers disposed at two ends of the plate body that are opposite to each other, where a shape of the welding layer changes with a cross-sectional shape of each of the signal transmission hole and the at least one ground hole, to implement continuity of characteristic impedance during signal transmission.

In an embodiment, a first positioning piece is further disposed on the side that is of the first circuit board and that faces the second circuit board, the first positioning piece is located on an outer side of the first welding area, and the first positioning piece is configured to position the connection plate and the first circuit board. In this case, reliability of electrical connection between the connection plate and the first circuit board is high, and signal transmission quality is high.

The first positioning piece includes at least one of a positioning block or a positioning point. For example, the first positioning piece includes a first positioning block and a second positioning block disposed at an interval. The connection plate is disposed between the first positioning block and the second positioning block to implement positioning.

In an embodiment, the application provides an electronic device. The electronic device includes a housing and the foregoing circuit board assembly. The circuit board assembly is accommodated in the housing. The electronic device may be any device having a communication and storage function. A plurality of components are disposed on the circuit board assembly, and the circuit board assembly is further configured to implement electrical connections between the plurality of components.

DESCRIPTION OF EMBODIMENTS

The following describes embodiments of the application with reference to the accompanying drawings in the embodiments of the application.

Figure 1:
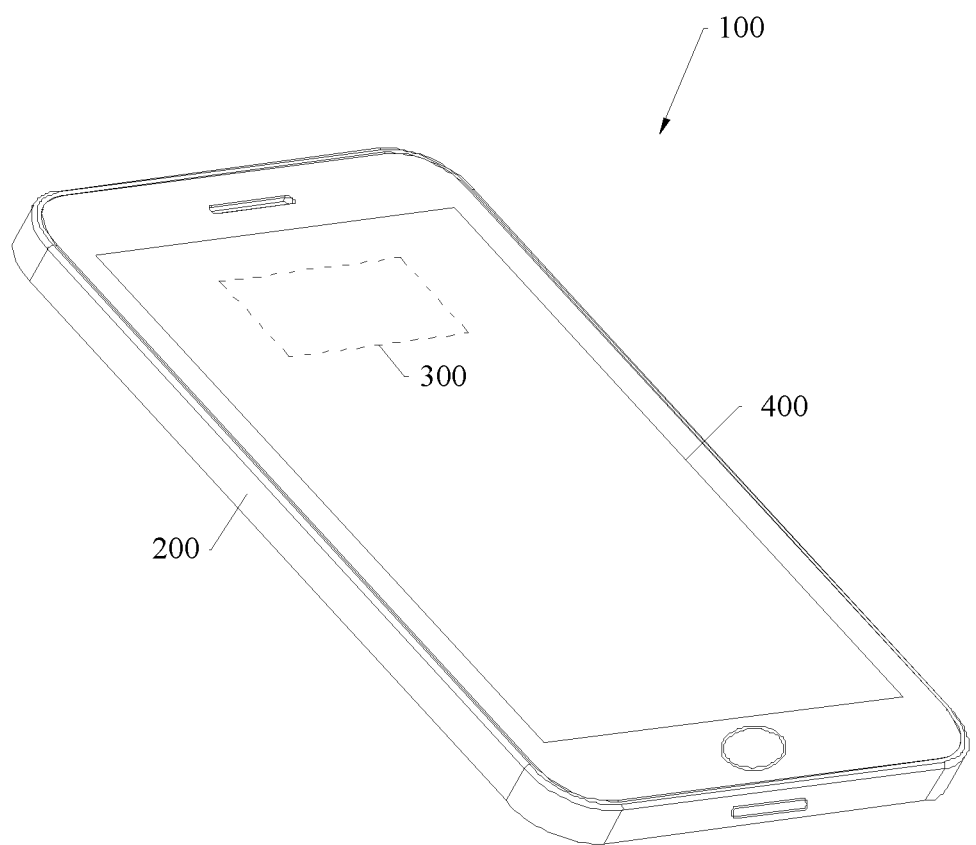
FIG. 1 is a schematic structural diagram of an electronic device according to an embodiment of the application.

Referring to FIG. 1, the application provides an electronic device 100. The electronic device 100 in the embodiment of the application may be any device that has a communication function and a storage function, for example, an intelligent device that has a network function, such as a tablet computer, a mobile phone, an e-reader, a remote control, a personal computer (PC), a notebook computer, a vehicle-mounted device, a web television, or a wearable device. In the embodiment of the application, for example, the electronic device 100 is a mobile phone.

Referring to FIG. 1, the electronic device 100 includes a housing 200 and a circuit board assembly 300. The circuit board assembly 300 is accommodated in the housing 200, and the housing 200 is configured to protect the circuit board assembly 300. A plurality of components are disposed on the circuit board assembly 300, and the circuit board assembly 300 is configured to implement electrical connections between the plurality of components. The electronic device 100 further includes a display screen 400. The display screen 400 is fastened to the housing 200, and the display screen 400 is configured to display an image. The display screen 400 is stacked on the circuit board assembly 300.

Figure 2:
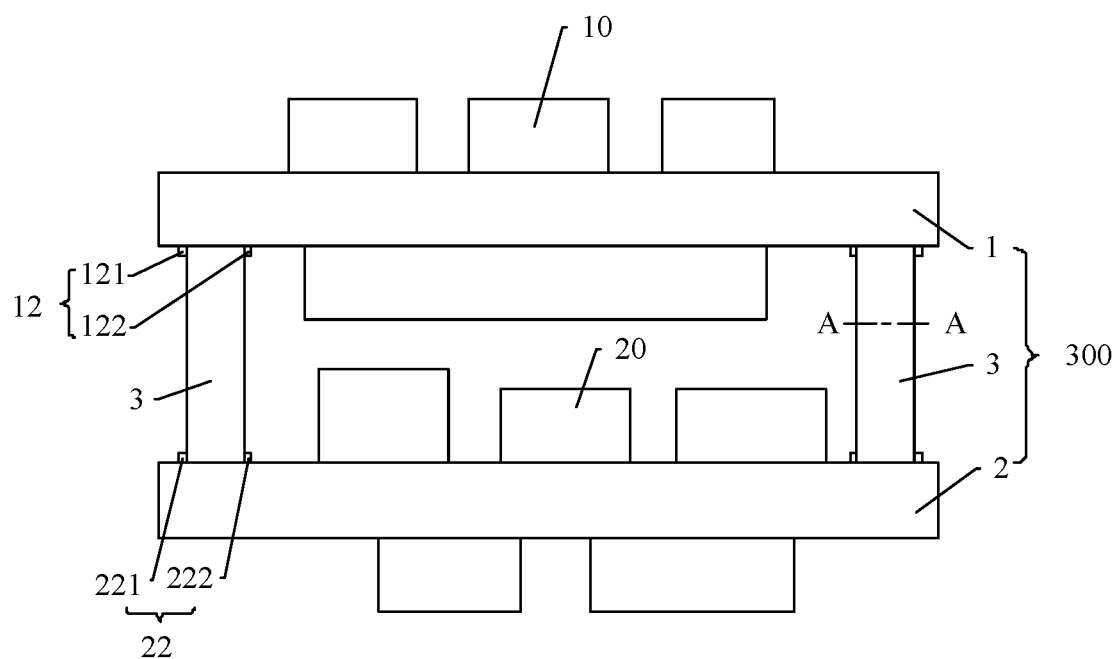
FIG. 2 is a schematic diagram of a use state of a circuit board assembly of the electronic device shown in FIG. 1.

Referring to FIG. 2, the circuit board assembly 300 includes a first circuit board 1, a second circuit board 2, and a connection plate 3. The connection plate 3 is connected between the first circuit board 1 and the second circuit board 2. The connection plate 3 may implement a structural connection between the first circuit board 1 and the second circuit board 2, and may further implement an electrical connection between the first circuit board 1 and the second circuit board 2. There may be one or more connection plates 3 connected between the second circuit board 2 and the first circuit board 1.

Referring to FIG. 2, a first component 10 is disposed on the first circuit board 1. The first component 10 may be disposed at two sides of the first circuit board 1 that are opposite to each other. The first component 10 includes but is not limited to one or more of a radio frequency integrated circuit (RFIC), a power amplifier (PA), a filter, a central processing unit (CPU), or a system on chip (SOC). A second component 20 is disposed on the second circuit board 2. The second component 20 may be disposed at two sides of the second circuit board 2 that are opposite to each other. The second component 20 includes but is not limited to one or more of a radio frequency integrated circuit (RFIC), a power amplifier (PA), a filter, a central processing unit (CPU), or a system on chip (SOC). The connection plate 3 is configured to implement an electrical connection between the first component 10 and the second component 20. A signal transmitted on the connection plate 3 includes but is not limited to one or more of a radio frequency signal, a ground signal, and a power signal. The radio frequency signal may be a high frequency signal, a very high frequency signal, or an ultra high frequency signal, and a frequency of the radio frequency signal falls within a range from 300 kilohertz (kHz) to 300 gigahertz (GHz). In an embodiment, the first component 10 is a radio frequency integrated circuit, the second component 20 is a central processing unit, and the connection plate 3 is configured to transmit a radio frequency signal between the radio frequency integrated circuit and the central processing unit.

Figure 3:
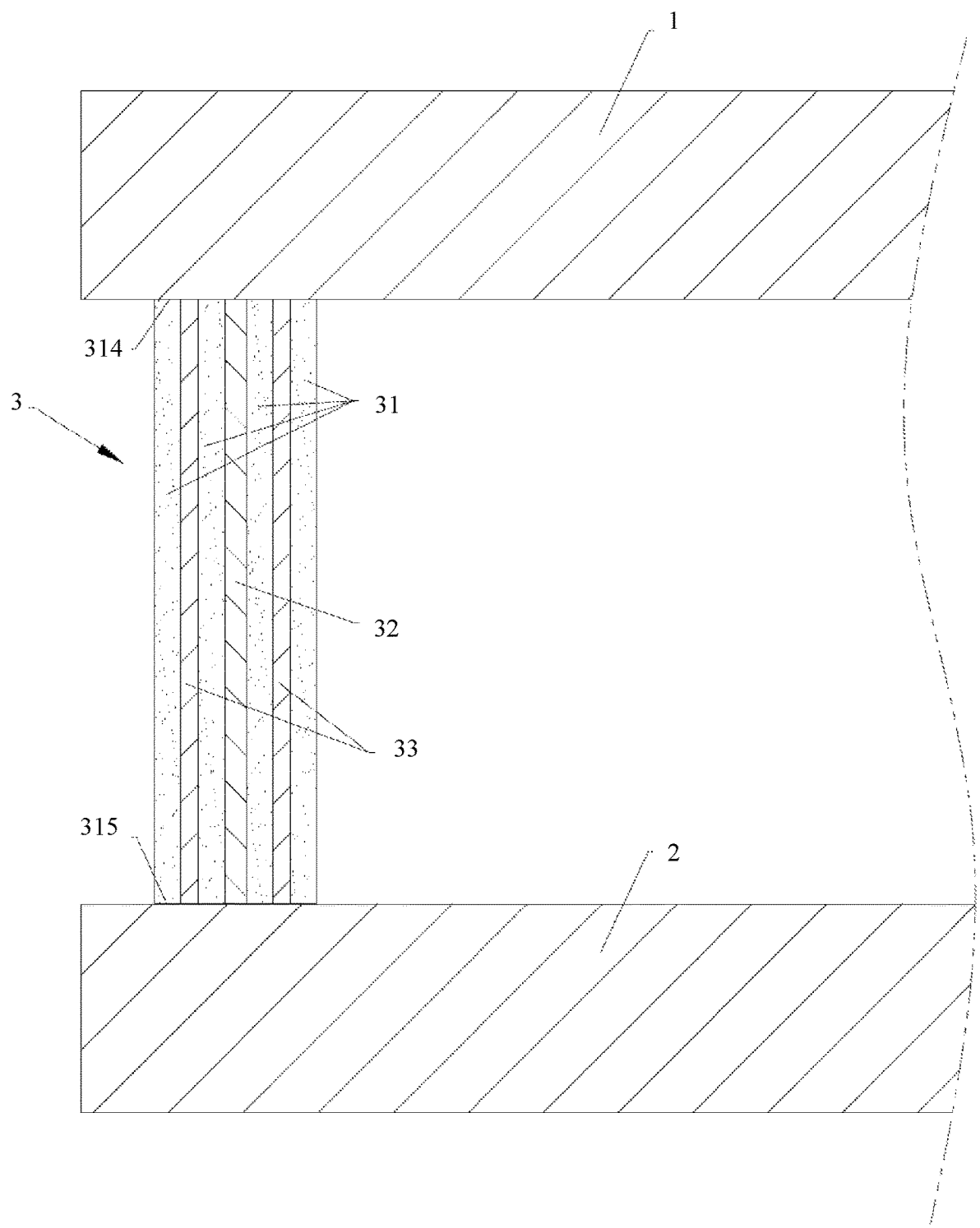
FIG. 3 is a schematic diagram of an internal structure of the circuit board assembly shown in FIG. 2.
Figure 4:
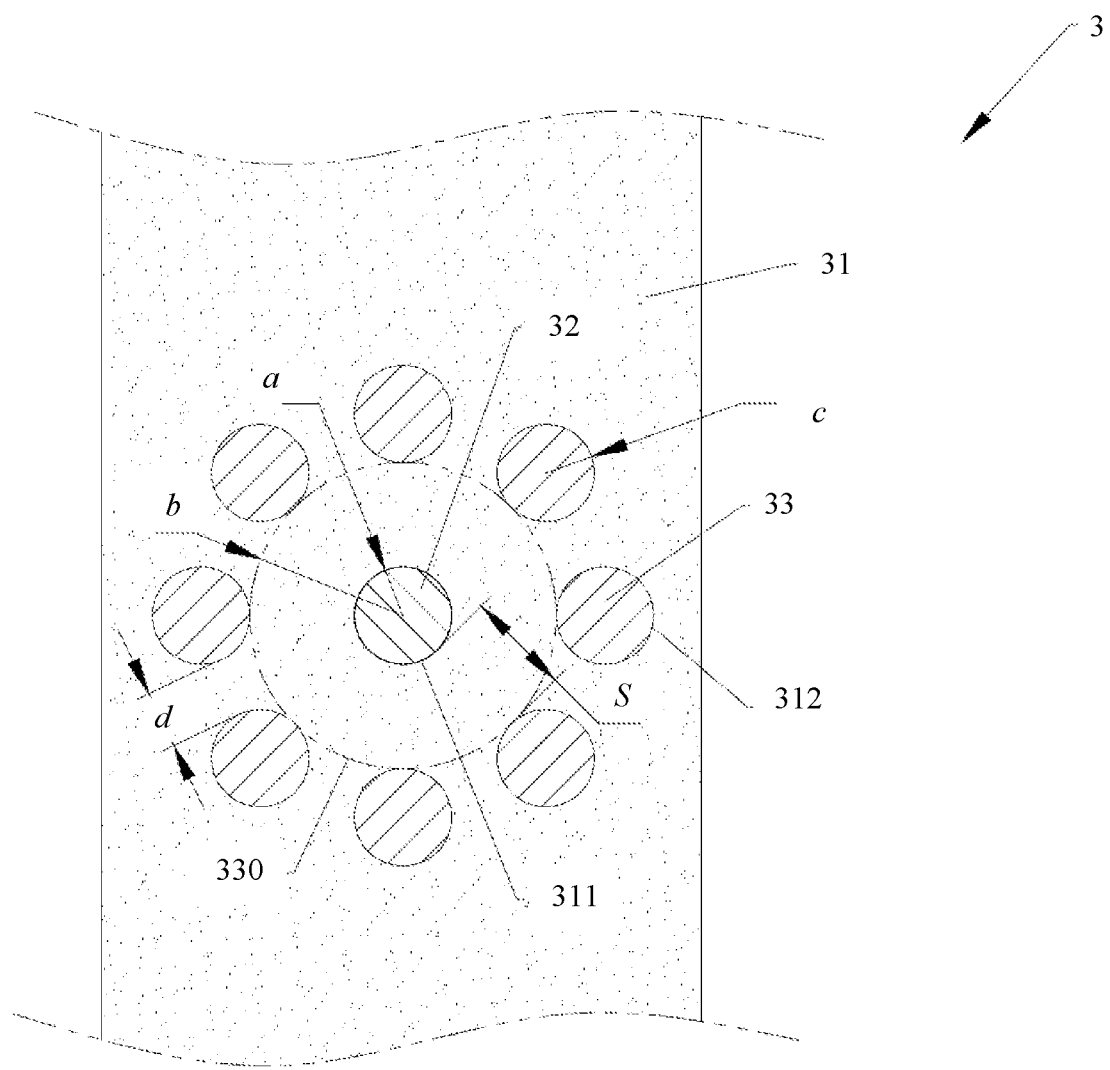
FIG. 4 is a schematic structural diagram of an embodiment of a structure of a connection plate shown in FIG. 2 at a line A-A.

Referring to both FIG. 3 and FIG. 4, the connection plate 3 includes a plate body 31, a signal transmission part 32, and a ground part 33. One end 314 of the plate body 31 is connected to the first circuit board 1, and the other end 315 of the plate body 31 is connected to the second circuit board 2. A signal transmission hole 311 and at least one ground hole 312 are disposed on the plate body 31. The signal transmission hole 311 extends from the end 314 of the plate body 31 to the other end 315 of the plate body 31. The signal transmission part 32 is disposed in the signal transmission hole 311. The signal transmission part 32 is connected to the first circuit board 1 and the second circuit board 2. The signal transmission part 32 is configured to transmit a signal between the first circuit board 1 and the second circuit board 2. The at least one ground hole 312 extends from the end 314 of the plate body 31 to the other end 315 of the plate body 31, and has a same extension path as the signal transmission hole 311. The at least one ground hole 312 surrounds the signal transmission hole 311 and is disposed with a spacing between the at least one ground hole 312 and the signal transmission hole 311. The ground part 33 is disposed in the at least one ground hole 312. The ground part 33 is connected to the first circuit board 1 and the second circuit board 2. The ground part 33 is configured to connect ground of the first circuit board 1 and ground of the second circuit board 2. In this case, the first circuit board 1, the ground part 33, and the second circuit board 2 are grounded continuously. In the application, for example, the signal transmission part 32 is configured to transmit a radio frequency signal. The radio frequency signal may include, but is not limited to, a wireless-fidelity (Wi-Fi) signal, a Bluetooth signal, a global navigation satellite system (GNSS) signal, a 2nd generation wireless telephone technology (2G) signal, a 3rd generation wireless telephone technology (3G) signal, a 4th generation wireless telephone technology (4G) signal, or a 5th generation wireless telephone technology (5G) signal.

Figure 5:
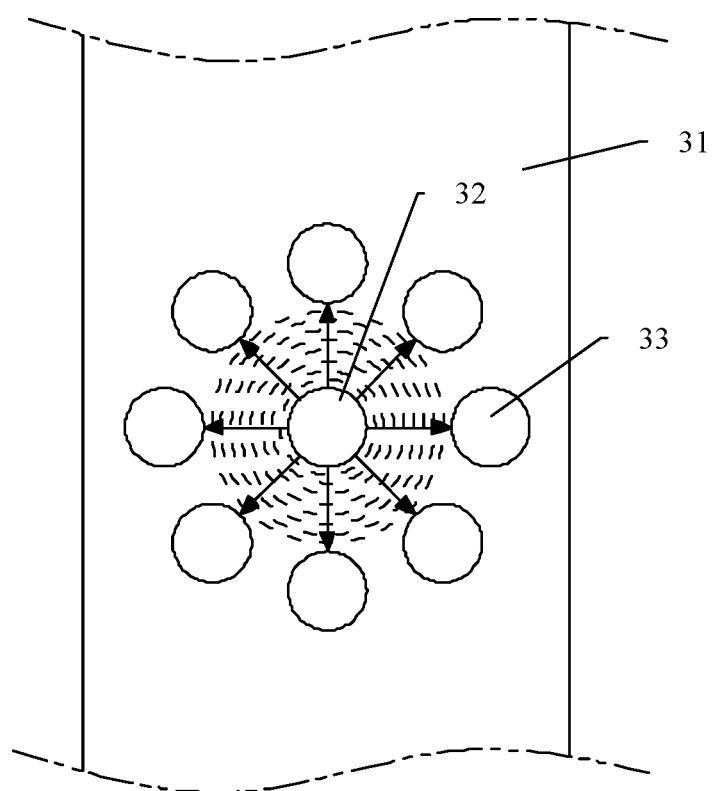
FIG. 5 is a schematic diagram of field distribution of an electric field and a magnetic field of a connection plate shown in FIG. 4.

In the embodiment, the at least one ground hole 312 surrounds the signal transmission hole 311 and is disposed with a spacing between the at least one ground hole 312 and the signal transmission hole 311, the ground part 33 is disposed in the at least one ground hole 312, and the signal transmission part 32 is disposed in the signal transmission hole 311, so that the ground part 33 surrounds the signal transmission part 32 and is disposed with a spacing between the ground part 33 and the signal transmission part 32. When a signal is transmitted by the signal transmission part 32, electric field distribution and magnetic field distribution are shown in FIG. 5. A solid line "—" with an arrow represents an electric field E, and a ring-shaped dashed line "---" represents a magnetic field H. The ground part 33 can be used as a reference ground for the signal transmitted by the signal transmission part 32, so that characteristic impedance of the signal transmission part 32 can be controlled by adjusting a radius (which is referred to as an inner radius a below) of the signal transmission part 32 and a radius (which is referred to as an outer radius b below) of a circle contour 330 that is tangent to each ground part 33 and that is between the signal transmission part 32 and the ground part 33. In this way, the characteristic impedance of the signal transmission part 32 is controllable, and good matching is maintained when the signal is transmitted on the first circuit board 1, the connection plate 3, and the second circuit board 2, thereby reducing an additional insertion loss caused by characteristic impedance mismatch. Therefore, an insertion loss of the signal transmitted by the signal transmission part 32 is relatively small, and a Smith chart is relatively converged. The at least one ground hole 312 and the signal transmission hole 311 have the same extension path. In other words, an extension path of the ground part 33 is the same as an extension path of the signal transmission part 32, and a routing direction of the ground part 33 is the same as a routing direction of the signal transmission part 32, so that a distance between the ground part 33 and the signal transmission part 32 remains unchanged. Therefore, the characteristic impedance of the signal transmission part 32 is more controllable. The ground part 33 can further shield signal radiation. Therefore, even if the signal transmission part 32 is equivalently used as a short antenna, when the signal is transmitted by the signal transmission part 32, the ground part 33 can effectively reduce radiation of the signal transmitted by the signal transmission part 32, and reduce interference caused by another signal for the signal transmitted by the signal transmission part 32, so that overall performance of the signal transmitted by the signal transmission part 32 is relatively good.

It may be understood that, the characteristic impedance of the signal transmission part 32 on the connection plate 3 can be accurately controlled, so that overall characteristic impedance of the circuit board assembly 300 to which the connection plate 3 is applied can also be controlled relatively accurately, and characteristic impedance of the electronic device 100 to which the circuit board assembly 300 is applied is highly controllable.

It may be understood that the signal transmission part 32 may be formed by filling the signal transmission hole 311 with a conductive material. Alternatively, a conductive wire is pre-buried and then the plate body 31 is formed, so that the conductive wire is used as the signal transmission part 32. In this case, the conductive wire is also filled in the signal transmission hole 311. In another embodiment, the signal transmission part 32 may not be filled in the signal transmission hole 311, but passes through the signal transmission hole 311 by using a wire. In this case, the signal transmission part 32 occupies a part of space of the signal transmission hole 311.

The ground part 33 may be formed by filling the at least one ground hole 312 with a conductive material. Alternatively, a conductive wire is pre-buried and then the plate body 31 is formed, so that the conductive wire is used as the ground part 33. In this case, the conductive wire is also filled in the at least one ground hole 312. In another embodiment, the ground part 33 may not be filled in the corresponding ground hole 312, but passes through the corresponding ground hole 312 by using a wire. In this case, the ground part 33 occupies a part of space of the corresponding ground hole 312.

As shown in FIG. 4, in the application, for example, the signal transmission part 32 is filled in the signal transmission hole 311 and the ground part 33 is filled in the at least one ground hole 312. A radius of the signal transmission hole 311 is the inner radius a. A radius of the circle contour 330 that is tangent to each ground hole 312 and that is between the signal transmission hole 311 and the at least one ground hole 312 is the outer radius b. A dielectric constant of the plate body 31 is $\varepsilon_r$. Surface resistances of conductors used for the signal transmission part 32 and the ground part 33 are $R_S$, and a magnetic permeability is 1.

Equivalent inductance L of the signal transmission part 32 is calculated according to Formula (1), equivalent capacitance C is calculated according to Formula (2), and equivalent resistance R is calculated according to Formula (3):

$$L = \frac{1}{2\pi} \ln \frac{b}{a} \quad (1)$$

$$C = \frac{2\pi \varepsilon_r}{\ln b/a} \quad (2)$$

$$R = \frac{R_S}{2\pi}\left(\frac{1}{a} + \frac{1}{b}\right) \quad (3)$$

Characteristic impedance Z is obtained by calculating the equivalent resistance R, the equivalent inductance L, and the equivalent capacitance C. Therefore, the characteristic impedance Z of the signal transmission part 32 can be accurately controlled by adjusting the inner radius a and the outer radius b. The dielectric plate used in the application may have any dielectric constant $\varepsilon_r$, and the characteristic impedance may meet a requirement of a designer through calculating and simulation optimization.

Figure 6:
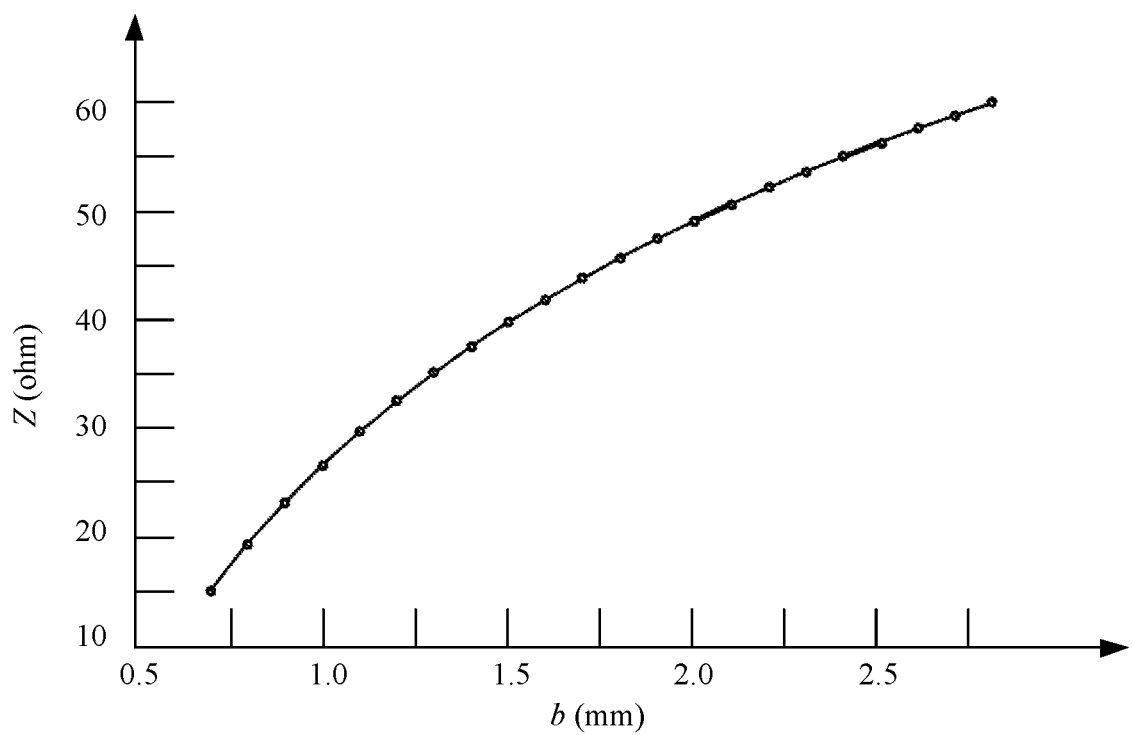
FIG. 6 is a curve diagram indicating changes of characteristic impedance and an outer radius of a connection plate shown in FIG. 4.

Referring to FIG. 6, in an embodiment, the inner radius a is 0.25 millimeter (mm), and the dielectric constant $\varepsilon_r$ is 3.5. A curve indicating changes of the characteristic impedance Z (ohm) and the outer radius b (mm) is shown in FIG. 6. The characteristic impedance Z increases depending on an increase of the outer radius b.

Figure 7:
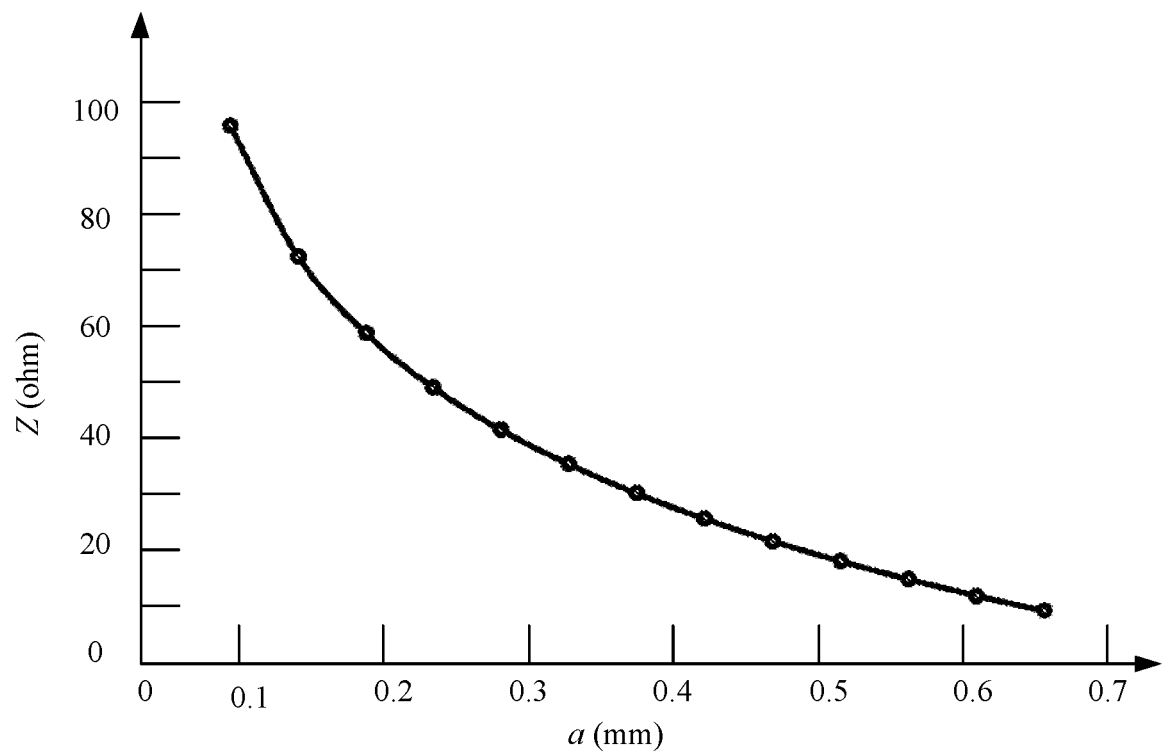
FIG. 7 is a curve diagram indicating changes of characteristic impedance and an inner radius of a connection plate shown in FIG. 4.

Referring to FIG. 7, in another embodiment, the outer radius b is 0.8 mm, and the dielectric constant $\varepsilon_r$ is 3.5. A curve indicating changes of the characteristic impedance Z (ohm) and the inner radius a (mm) is shown in FIG. 7. The characteristic impedance Z decreases depending on an increase of the inner radius a.

In the application, structures and relative positions of the signal transmission hole 311 and the at least one ground hole 312 are implemented in a plurality of forms, including:

In a first embodiment, referring to FIG. 4, there are at least two ground holes 312. A distance between adjacent ground holes 312 is d. The distance d is a minimum distance between hole walls of the two adjacent ground holes 312, and the distance d meets the following condition:

$$d \leq \lambda/n \quad (4)$$

The signal transmission part 32 is configured to transmit a signal whose highest frequency is f. In other words, a highest frequency in a frequency band used for transmitting a radio frequency signal by the signal transmission part 32 is f. The highest frequency f corresponds to a wavelength $\lambda$, and $n \geq 4$.

Figure 8:
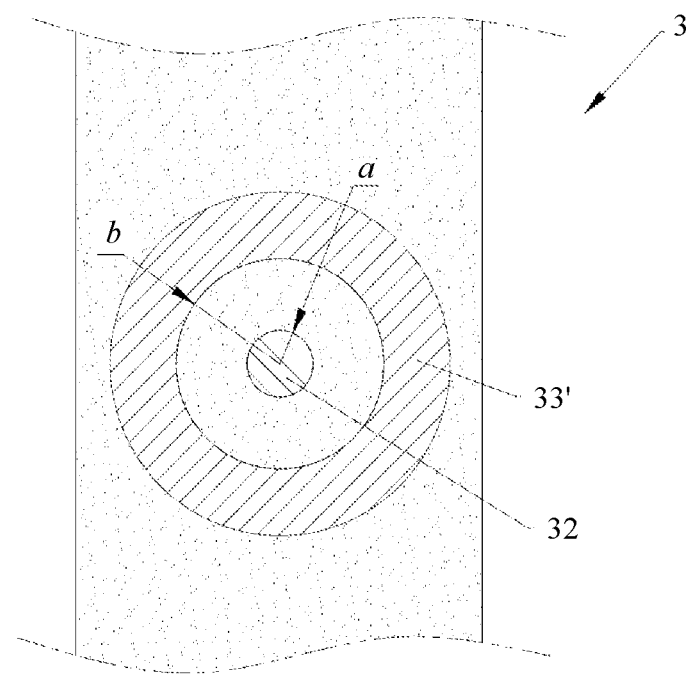
FIG. 8 is a schematic diagram of an equivalent physical model of a connection plate shown in FIG. 4.

It is proved through an experiment that when $n \geq 4$, a value of the distance d obtained through calculation according to Formula (4) is very small. In other words, the distance d between the adjacent ground holes 312 is very small, and the ground part 33 filled in all the ground holes 312 is equivalent to a closed ring-shaped ground part 33' shown in FIG. 8. This ensures a characteristic impedance control effect and a shielding effect of the ground part 33 for the signal transmission part 32. It may be understood that a smaller distance d between the adjacent ground holes 312 indicates a better characteristic impedance control effect and a better shielding effect of the ground part 33.

It may be understood that, because a higher signal frequency indicates a shorter wavelength, a signal with a high frequency is easy to radiate out by bypassing a gap between adjacent ground holes 312. Therefore, in an embodiment, the distance d is set based on the wavelength λ corresponding to the highest frequency f. When affecting the signal with the highest frequency f, the ground part 33 inevitably affects another signal whose frequency is lower than the highest frequency f. This ensures reliability of the ground part 33.

When n=10, the connection plate 3 can make a better balance between a quantity of the ground holes 312 and the characteristic impedance control effect and the shielding effect of the ground part 33, so that the connection plate 3 has low costs and high reliability.

As shown in FIG. 4, all the ground holes 312 are arranged with an equal distance therebetween in a circumference direction of the signal transmission hole 311. In this case, the distance between the adjacent ground holes 312 is equal, so that the characteristic impedance control effect and the shielding effect of the ground part 33 are better, a preparation process of the ground part 33 is simpler and more reliable, thereby reducing a defective ratio of the connection plate 3. In another embodiment, all the ground holes 312 may alternatively be arranged with unequal distances therebetween in a circumference direction of the signal transmission hole 311, but the distance between any two adjacent ground holes 312 needs to meet Formula (4).

As shown in FIG. 4, spacings S between all the ground holes 312 and the signal transmission hole 311 are equal. In this case, a center of the circle contour 330 overlaps a center of the signal transmission hole 311. Each of the ground holes 312 is in contact with the circle contour 330 that is tangent to each of the ground holes 312 and that is between the signal transmission hole 311 and each of the ground holes 312, and all the ground holes 312 can perform both characteristic impedance control and shielding, so that the characteristic impedance of the signal transmission part 32 is controlled more accurately, and a radiation shielding effect is better. In another embodiment, spacings between all the ground holes 312 and the signal transmission hole 311 may be unequal.

Figure 9:
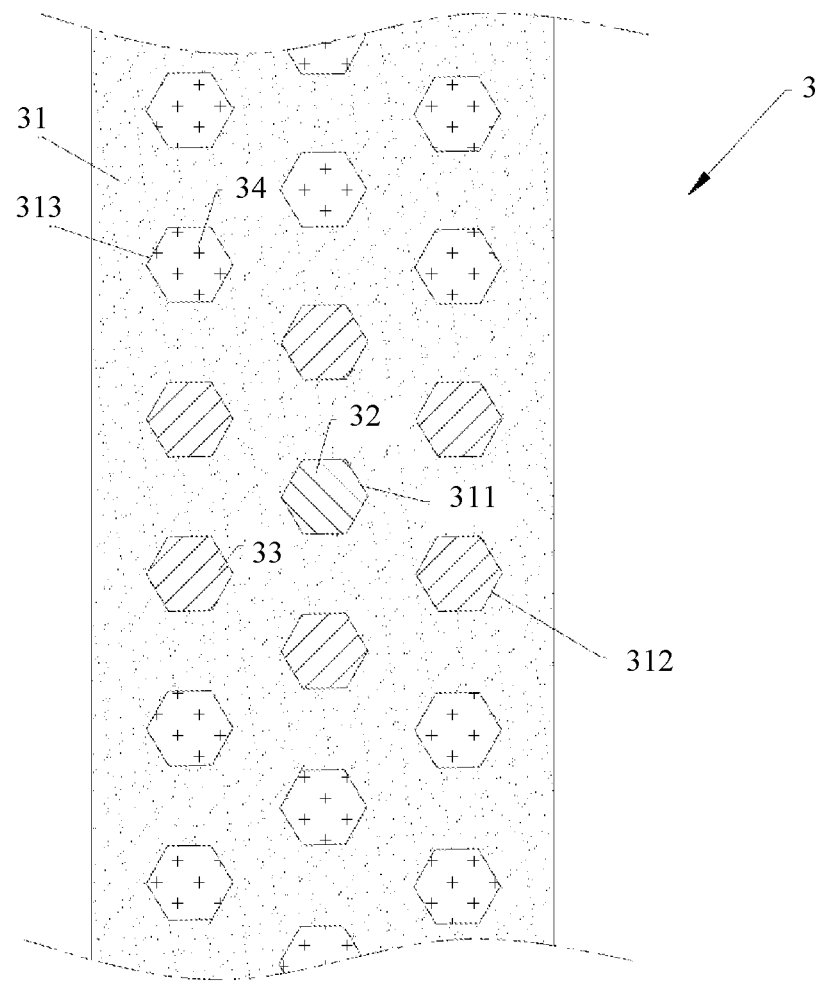
FIG. 9 is a schematic structural diagram of another embodiment of a structure of a connection plate shown in FIG. 2 at a line A-A.

In an optional embodiment, referring to both FIG. 4 and FIG. 9, a cross-sectional shape of the ground hole 312 is the same as a cross-sectional shape of the signal transmission hole 311. In this case, all the ground holes 312 and the signal transmission hole 311 may be processed by using a same jig, so that a processing difficulty and costs of the connection plate 3 are relatively low. This also helps to set the inner radius a and the outer radius b based on the required characteristic impedance Z.

The signal transmission hole 311 and the ground hole 312 may have a plurality of cross-sectional shapes.

For example, as shown in FIG. 4, a cross-sectional shape of the signal transmission hole 311 is a circle, and a cross-sectional shape of the ground hole 312 is a circle. In this case, a radius of the circle is the inner radius a, and a radius of the circle contour 330 that is tangent to each of the ground holes 312 and that is between the signal transmission hole 311 and each of the ground holes 312 is the outer radius b. Herein, a minimum distance between two adjacent circles is d. The minimum distance is located on a connection line between centers of the two adjacent circles. A single ground hole 312 has a radius c. The radius c may be set to any value.

In another embodiment, a cross-sectional shape of the signal transmission hole 311 may also be an ellipse or a polygon. The polygon includes but is not limited to a triangular shape, a quadrilateral (for example, a square or a rhomb), a pentagon, a hexagon, or the like. As shown in FIG. 9, a cross-sectional shape of the signal transmission hole 311 is a regular hexagon. A cross-sectional shape of the ground hole 312 is a regular hexagon.

Figure 10:
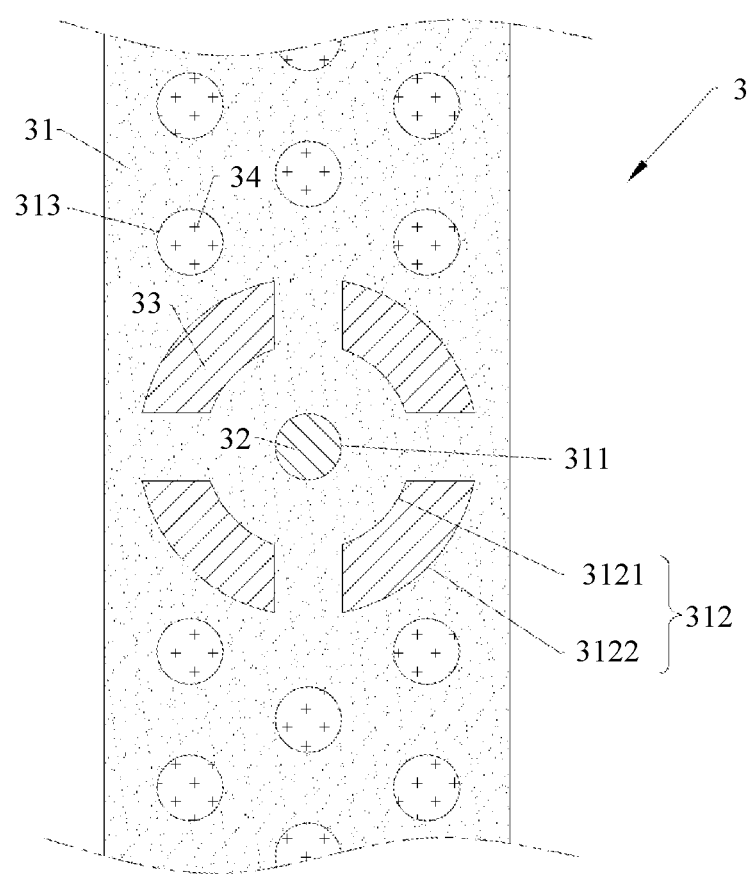
FIG. 10 is a schematic structural diagram of another embodiment of a structure of a connection plate shown in FIG. 2 at a line A-A.
Figure 11:
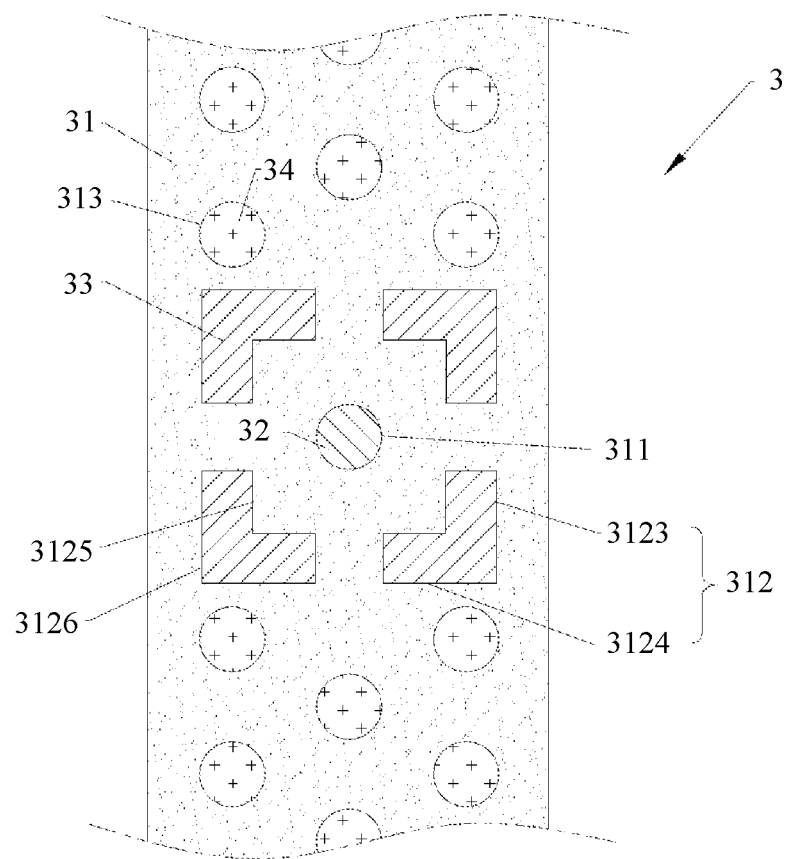
FIG. 11 is a schematic structural diagram of another embodiment of a structure of a connection plate shown in FIG. 2 at a line A-A.

In another optional embodiment, referring to both FIG. 10 and FIG. 11, a cross-sectional shape of the ground hole 312 is different from a cross-sectional shape of the signal transmission hole 311.

For example, as shown in FIG. 10, a cross-sectional shape of the signal transmission hole 311 is a circle, and a cross-sectional shape of the ground hole 312 is a sector. The cross-sectional shape of the ground hole 312 includes an inner arc edge 3121 and an outer arc edge 3122 that are opposite to each other, and the signal transmission hole 311 is located on a side that is of the inner arc edge 3121 and that is away from the outer arc edge 3122. Relative edges of adjacent sectors are parallel to each other, so that a gap between adjacent ground holes 312 can be narrowed, and a risk that the radiation of the signal transmitted by the signal transmission part 32 passes through the ground part 33 can be reduced.

Alternatively, as shown in FIG. 11, a cross-sectional shape of the signal transmission hole 311 is a circle. There are four ground holes 312. A cross-sectional shape of each ground hole 312 includes a first area 3123 and a second area 3124, and the first area 3123 is perpendicularly connected to the second area 3124. A cross-sectional shape of the ground hole 312 is approximately a right-angle ruler. The cross-sectional shape of the ground hole 312 includes an inner side edge 3125 and an outer side edge 3126 that are opposite to each other, and the signal transmission hole 311 is located on a side that is of the inner side edge 3125 and that is away from the outer side edge 3126. Relative edges of the first area 3123 and the second area 3124 that are adjacent and not connected are parallel to each other, so that a gap between adjacent ground holes 312 can be narrowed, and a risk that the radiation of the signal transmitted by the signal transmission part 32 passes through the ground part 33 can be reduced.

Figure 12:
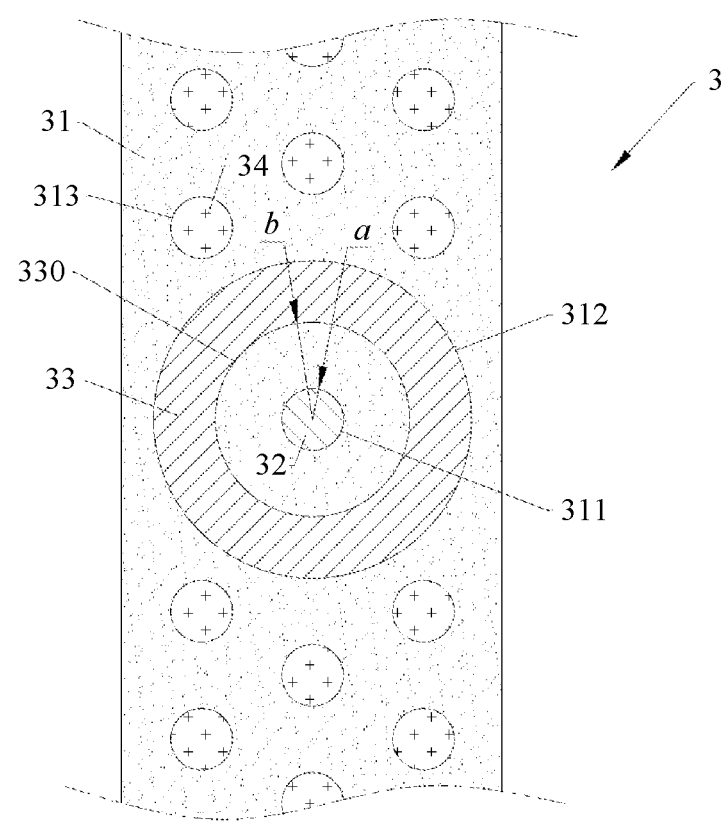
FIG. 12 is a schematic structural diagram of another embodiment of a structure of a connection plate shown in FIG. 2 at a line A-A.
Figure 13:
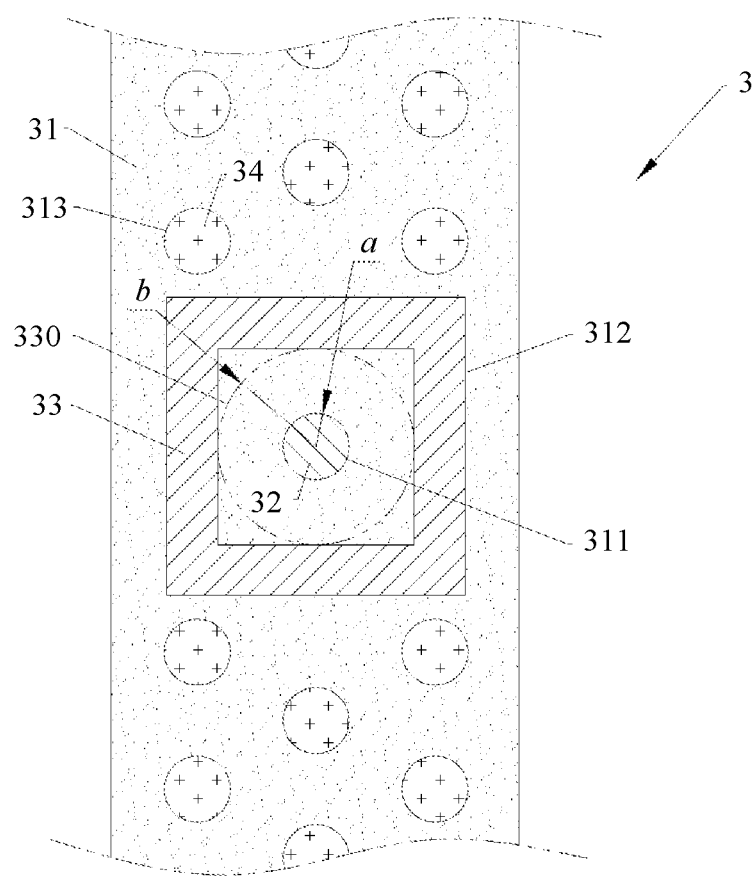
FIG. 13 is a schematic structural diagram of another embodiment of a structure of a connection plate shown in FIG. 2 at a line A-A.

In an embodiment, referring to both FIG. 12 and FIG. 13, there is one ground hole 312. A cross-sectional shape of the ground hole 312 is a closed ring. In this case, a characteristic impedance control function and a shielding function of the ground part 33 are more reliable, and the signal transmitted by the signal transmission part 32 cannot radiate outwards by bypassing the ground part 33. A radius of the circle contour 330 that is tangent to each ground hole 312 and that is between the signal transmission hole 311 and the ground hole 312 is the outer radius b. The circle contour is a contour of a side facing the signal transmission hole 311.

A cross-sectional shape of the signal transmission hole 311 is a circle. A radius of the circle is the inner radius a. The cross-sectional shape of the ground hole 312 is a circular ring, an elliptical ring, or a polygon ring. The polygon ring includes but is not limited to a trilateral ring, a quadrilateral ring (for example, a square ring, a rectangular ring, or a rhombic ring), a pentagon ring, a hexagon ring, or the like. As shown in FIG. 13, a cross-sectional shape of the ground hole 312 is a square ring.

In an embodiment, a material used by the ground part 33 is the same as a material used by the signal transmission part 32. In this case, characteristic impedance of the signal transmission part 32 is more easily calculated, designed, and adjusted. In another embodiment, a material used by the ground part 33 may be different from a material used by the signal transmission part 32.

In an embodiment, referring to FIG. 9 to FIG. 14, connection holes 313 are further disposed on the plate body 31. The connection holes 313 are located on a side that is of the at least one ground hole 312 and that is away from the signal transmission hole 311. The connection plate 3 further includes connection parts 34. The connection parts 34 are disposed in the connection holes 313, and the connection parts 34 are configured to transmit a signal that is different from the signal transmitted by the signal transmission part 32. The signal transmission part 32 is configured to transmit a signal having a relatively high requirement for characteristic impedance, and the connection parts 34 may be configured to transmit a signal that does not have a high requirement for characteristic impedance. For example, the connection parts 34 may be configured to transmit a power signal, a ground signal, or another signal.

In an embodiment, the connection holes 313 are located on the side that is of the at least one ground hole 312 and that is away from the signal transmission hole 311, so that the connection parts 34 are disposed on a side that is of the ground part 33 and that is away from the signal transmission part 32, disposition of the connection parts 34 does not cause adverse impact on the signal transmitted by the signal transmission part 32, and the connection plate 3 can transmit another signal that does not have a high requirement for characteristic impedance while ensuring quality of the signal transmitted by the signal transmission part 32. Therefore, an integration level of the connection plate 3 is high.

Figure 14:
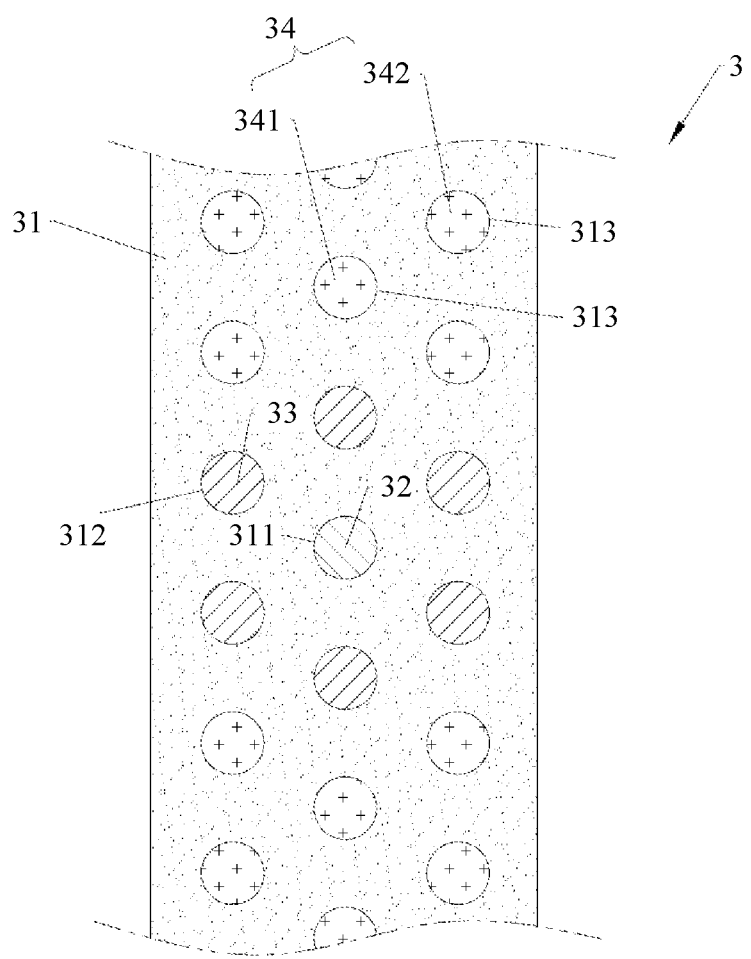
FIG. 14 is a schematic structural diagram of another embodiment of a structure of a connection plate shown in FIG. 2 at a line A-A.

As shown in FIG. 14, the connection parts 34 include a first connection part 341 and a second connection part 342. There are at least two connection holes 313, and the first connection part 341 and the second connection part 342 are disposed in different connection holes 313. The first connection part 341 and the second connection part 342 are configured to transmit different signals. In this case, the integration level of the connection plate 3 is further improved. In an embodiment, the first connection part 341 is configured to transmit a power signal. The second connection part 342 is configured to implement a ground connection.

A cross-sectional shape of the connection hole 313 is the same as a cross-sectional shape of the signal transmission hole 311. In this case, a process difficulty of the connection plate 3 is relatively low, and processing costs are relatively low.

It may be understood that structures and arrangement manners of the signal transmission part 32 and the ground part 33 in the application are not limited to the foregoing embodiments, and manners in which the ground part 33 is disposed around the signal transmission part 32 to implement characteristic impedance control and shielding fall within the coverage and protection scope of the patent application.

Figure 15:
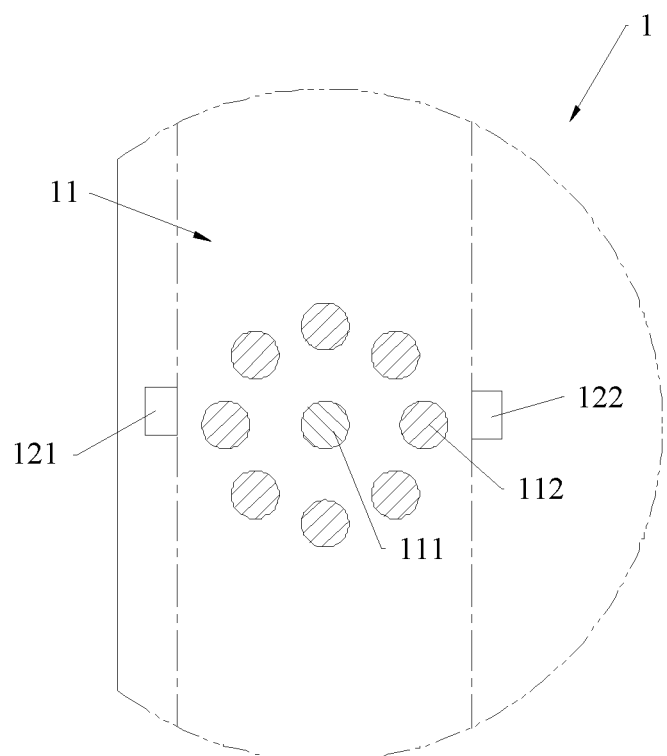
FIG. 15 is a schematic structural diagram of an embodiment of a first circuit board of the circuit board assembly shown in FIG. 2.
Figure 16:
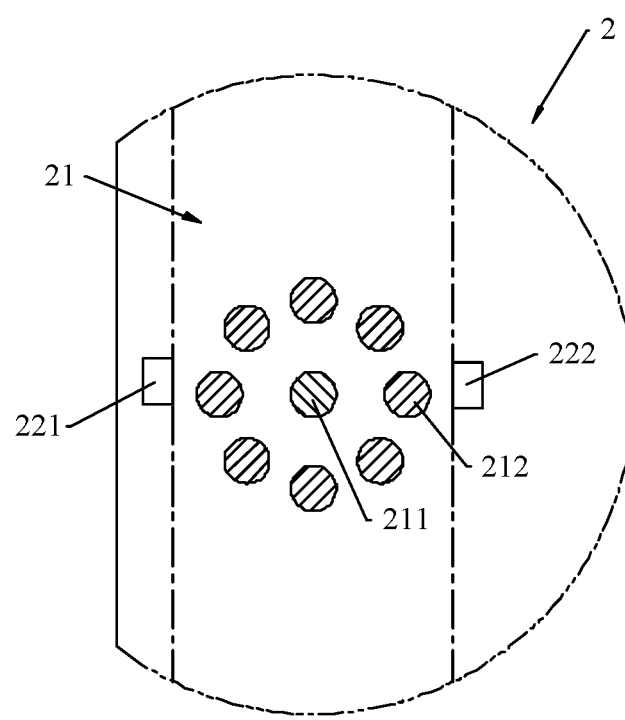
FIG. 16 is a schematic structural diagram of an embodiment of a second circuit board of the circuit board assembly shown in FIG. 2.

In an embodiment, referring to FIG. 3, FIG. 4, FIG. 15, and FIG. 16, the first circuit board 1 and the second circuit board 2 are stacked. In this case, the circuit board assembly 300 includes a multilayer circuit board stacking architecture, and can be widely applied to various electronic devices 100. As shown in FIG. 15, a first welding area 11 is disposed on a side that is of the first circuit board 1 and that faces the second circuit board 2. As shown in FIG. 16, a second welding area 21 is disposed on a side that is of the second circuit board 2 and that faces the first circuit board 1. As shown in FIG. 3, the end 314 of the plate body 31 abuts against the first welding area 11, and the other end 315 of the plate body 31 abuts against the second welding area 21. The end 314 of the plate body 31 is fixedly connected to the first welding area 11 in a welding manner (for example, coated with a tin soldering layer), to implement structural connection and electrical connection. The other end 315 of the plate body 31 is fixedly connected to the second welding area 21 in a welding manner (for example, coated with a tin soldering layer), to implement structural connection and electrical connection. The connection plate 3 is a bar plate, so that continuity of characteristic impedance of the signal transmitted by the signal transmission part 32 is relatively great.

As shown in FIG. 15, a first signal transmission pad 111 and at least one first ground pad 112 are disposed in the first welding area 11. The at least one first ground pad 112 surrounds the first signal transmission pad 111 and is disposed with a spacing between the at least one first ground pad 112 and the first signal transmission pad 111. A shape of the first signal transmission pad 111 is the same as the cross-sectional shape of the first signal transmission hole 311 (as shown in FIG. 4). In other words, the shape of the first signal transmission pad 111 changes with the cross-sectional shape of the first signal transmission hole 311, and the first signal transmission pad 111 and the first signal transmission hole 311 overlap to implement continuity of characteristic impedance during signal transmission. A shape of the at least one first ground pad 112 is the same as the cross-sectional shape of the at least one ground hole 312 (as shown in FIG. 4). In other words, the shape of the at least one first ground pad 112 changes with the cross-sectional shape of the at least one ground hole 312, and the at least one first ground pad 112 and the at least one ground hole 312 overlap to implement continuity of characteristic impedance during signal transmission.

As shown in FIG. 16, a second signal transmission pad 211 and at least one second ground pad 212 are disposed in the second welding area 21. The at least one second ground pad 212 surrounds the second signal transmission pad 211 and is disposed with a spacing between the at least one second ground pad 212 and the second signal transmission pad 211. A shape of the second signal transmission pad 211 is the same as the cross-sectional shape of the first signal transmission hole 311 (as shown in FIG. 4). In other words, the shape of the second signal transmission pad 211 changes with the cross-sectional shape of the first signal transmission hole 311, and the second signal transmission pad 211 and the first signal transmission hole 311 overlap to implement continuity of characteristic impedance during signal transmission. A shape of the at least one second ground pad 212 is the same as the cross-sectional shape of the at least one ground hole 312 (as shown in FIG. 4). In other words, the shape of the at least one second ground pad 212 changes with the cross-sectional shape of the at least one ground hole 312, and the at least one second ground pad 212 and the at least one ground hole 312 overlap to implement continuity of characteristic impedance during signal transmission.

Figure 17:
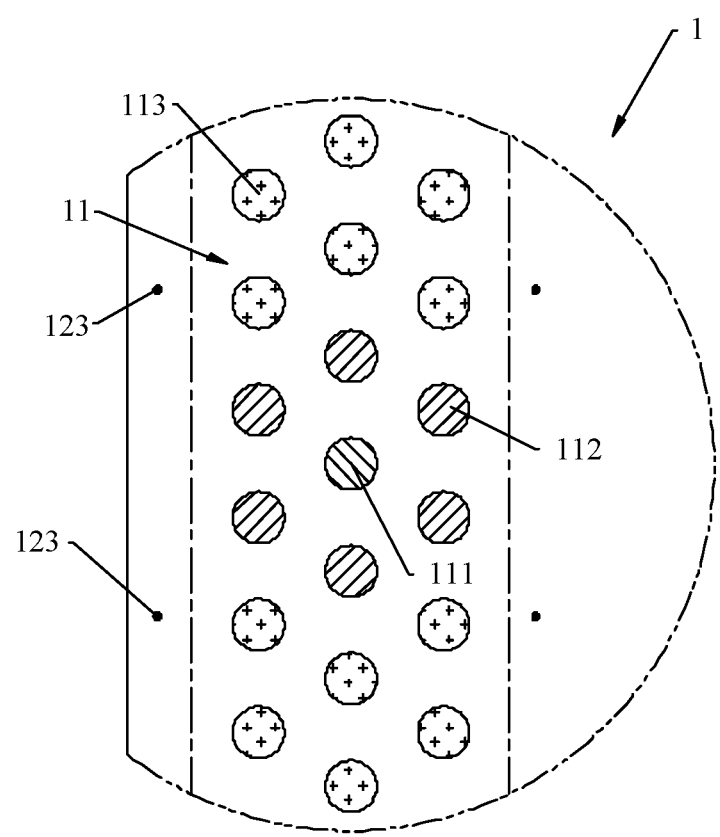
FIG. 17 is a schematic structural diagram of another embodiment of a first circuit board of the circuit board assembly shown in FIG. 2.

In an embodiment, referring to FIG. 17, a first connection pad 113 is further disposed in a first pad area 11. The first connection pad 113 is located on a side that is of the at least one first ground pad 112 and that is away from the first signal transmission pad 111. Referring to both FIG. 14 and FIG. 17, the first connection pad 113 is configured to connect to the connection parts 34. A shape of the first connection pad 113 is the same as the cross-sectional shape of the connection hole 313. In other words, the shape of the first connection pad 113 changes with the cross-sectional shape of the connection hole 313, and the first connection pad 113 and the connection hole 313 overlap. A quantity and positions of the first connection pads 113 adapt to a quantity and positions of the connection holes 313. In another embodiment, a shape of the first connection pad 113 may also be different from the cross-sectional shape of the connection hole 313.

Figure 18:
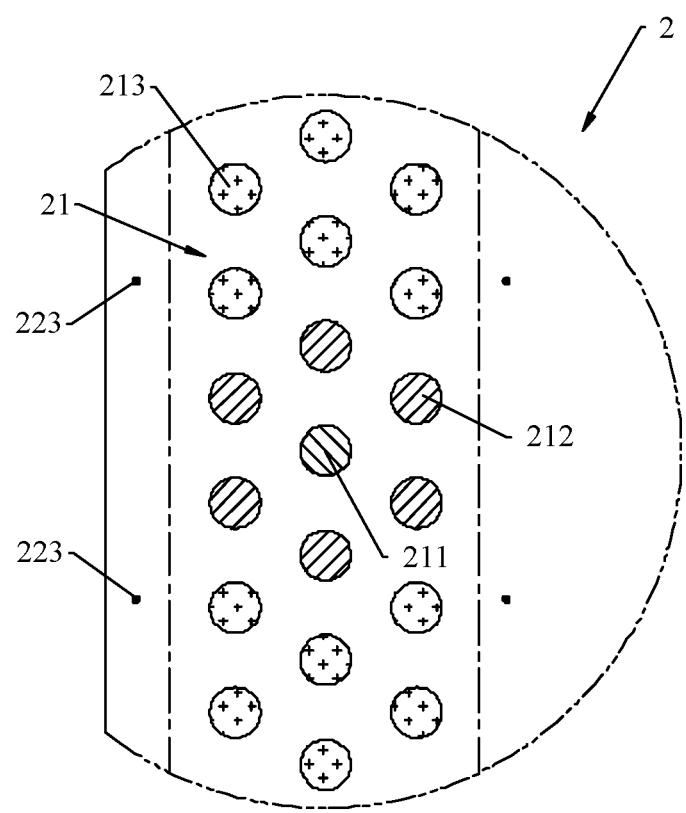
FIG. 18 is a schematic structural diagram of another embodiment of a second circuit board of the circuit board assembly shown in FIG. 2.

Referring to FIG. 18, a second connection pad 213 is further disposed in a second pad area 21. The second connection pad 213 is located on a side that is of the at least one second ground pad 212 and that is away from the second signal transmission pad 211. Referring to both FIG. 14 and FIG. 18, the second connection pad 213 is configured to connect to the connection parts 34. A shape of the second connection pad 213 is the same as the cross-sectional shape of the connection hole 313. In other words, the shape of the second connection pad 213 changes with the cross-sectional shape of the connection hole 313, and the second connection pad 213 and the connection hole 313 overlap. A quantity and positions of the second connection pads 213 adapt to a quantity and positions of the connection holes 313. In another embodiment, a shape of the second connection pad 213 may also be different from the cross-sectional shape of the connection hole 313.

In an embodiment, the circuit board assembly 300 further includes two welding layers disposed at two ends of the plate body 31 that are opposite to each other. A shape of the welding layer changes with the cross-sectional shape of each of the signal transmission hole 311 and the at least one ground hole 312, to implement continuity of characteristic impedance during signal transmission.

In an embodiment, referring to FIG. 2, FIG. 15, and FIG. 17, a first positioning piece 12 is disposed on a side that is of the first circuit board 1 and that faces the second circuit board 2. The first positioning piece 12 is located on an outer side of the first welding area 11. The first positioning piece 12 is configured to position the connection plate 3 and the first circuit board 1. In this case, reliability of electrical connection between the connection plate 3 and the first circuit board 1 is high, and signal transmission quality is high.

The first positioning piece 12 includes at least one of a positioning block (121/122) or a positioning point (123).

For example, as shown in FIG. 2 and FIG. 15, the first positioning piece 12 includes a first positioning block 121 and a second positioning block 122 disposed at an interval. The connection plate 3 is disposed between the first positioning block 121 and the second positioning block 122 to implement positioning. In another embodiment, only the first positioning block 121 or the second positioning block 122 may be disposed, and one side of the connection plate 3 abuts against the first positioning block 121 or the second positioning block 122, to implement positioning.

Alternatively, as shown in FIG. 17, the first positioning piece 12 includes a first positioning point 123. When the connection plate 3 and the first circuit board 1 are assembled, an assembled device implements alignment between the connection plate 3 and the first circuit board 1 by using the first positioning point 123 as a reference point, so that the assembled connection plate 3 and the first circuit board 1 are positioned accurately with each other. There may be a plurality of first positioning points 123, and the plurality of first positioning points 123 are disposed distributedly. In another embodiment, both a positioning block and a positioning point may be disposed on the first circuit board 1.

Referring to FIG. 2, FIG. 16, and FIG. 18, a second positioning piece 22 is disposed on a side that is of the second circuit board 2 and that faces the first circuit board 1. The second positioning piece 22 is located on an outer side of the second welding area 21. The second positioning piece 22 is configured to position the connection plate 3 and the second circuit board 2. In this case, reliability of electrical connection between the connection plate 3 and the second circuit board 2 is high, and signal transmission quality is high.

The second positioning piece 22 includes at least one of a positioning block (221/222) or a positioning point (223).

For example, as shown in FIG. 2 and FIG. 16, the second positioning piece 22 includes a third positioning block 221 and a fourth positioning block 222 disposed at an interval. The connection plate 3 is disposed between the third positioning block 221 and the fourth positioning block 222 to implement positioning. In another embodiment, only the third positioning block 221 or the fourth positioning block 222 may be disposed, and one side of the connection plate 3 abuts against the third positioning block 221 or the fourth positioning block 222, to implement positioning.

Alternatively, as shown in FIG. 18, the second positioning piece 22 includes a second positioning point 223. When the connection plate 3 and the second circuit board 2 are assembled, an assembled device implements alignment between the connection plate 3 and the second circuit board 2 by using the second positioning point 223 as a reference point, so that the assembled connection plate 3 and the second circuit board 2 are positioned accurately with each other. There may be a plurality of second positioning points 223, and the plurality of second positioning points 223 are disposed distributedly. In another embodiment, both a positioning block and a positioning point may be disposed on the second circuit board 2.

Figure 19:
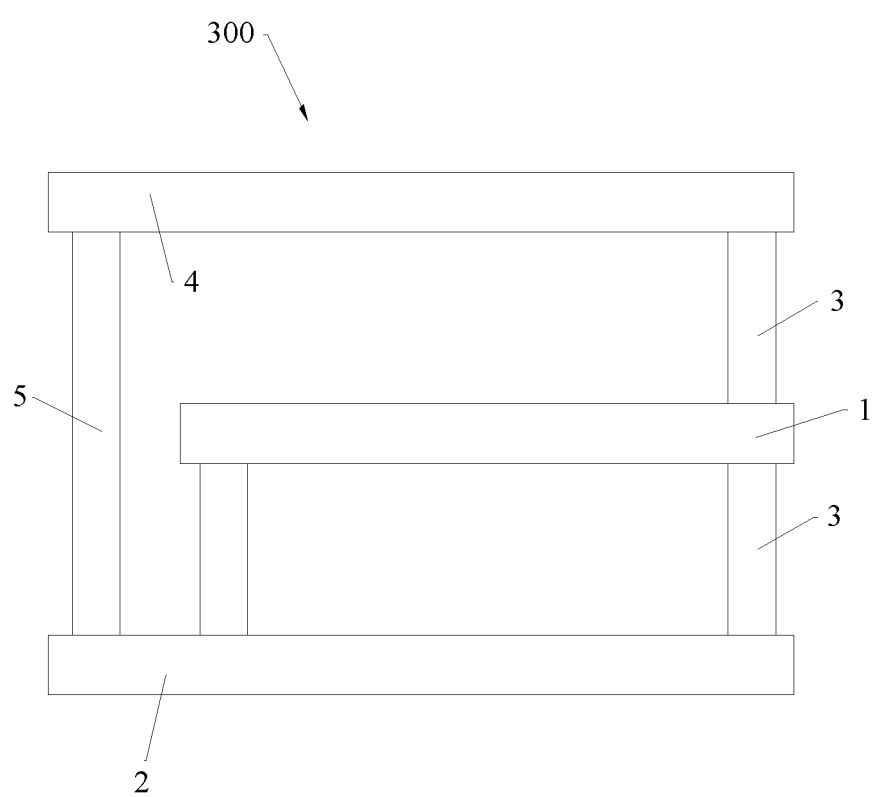
FIG. 19 is a front view of another embodiment of a circuit board assembly of the electronic device shown in FIG. 1.

In an embodiment, referring to FIG. 19, the circuit board assembly 300 further includes a third circuit board 4. The third circuit board 4 and the first circuit board 1 are stacked, and are disposed on a side that is of the first circuit board 1 and that is away from the second circuit board 2. A structural connection and an electrical connection may be implemented between the third circuit board 4 and the second circuit board 2 by using the connection plate 3. A structural connection and an electrical connection may be implemented between the third circuit board 4 and the second circuit board 2 by using a connection plate 5 (where a structure of the connection plate 5 is the same as that of the connection plate 3, and the connection plate 5 spans the first circuit board 1). There may be one or more connection plates 5 connected between the third circuit board 4 and the second circuit board 2.

In another embodiment, the first circuit board 1 and the second circuit board 2 may be disposed in parallel. In this case, a shape of the connection plate 3 changes accordingly.

The foregoing descriptions are merely specific embodiments of the application, but are not intended to limit the protection scope of the application. Any variation or replacement readily figured out by one of ordinary skill in the art within the technical scope disclosed in the application shall fall within the protection scope of the application. Therefore, the protection scope of the application shall be subject to the protection scope of the claims.

What is claimed is:

1. An electronic device, comprising: a housing; a display screen fastened to the housing and configured to display an image; and a circuit board assembly accommodated in the housing, and comprising: a first circuit board, wherein a first component is disposed on the first circuit board; a second circuit board stacked with the first circuit board, wherein a second component is disposed on the second circuit board; and a connection plate between the first circuit board and the second circuit board, the connection plate including a plate body, wherein one end of the plate body is connected to the first circuit board, and the other end of the plate body is connected to the second circuit board; the connection plate including: a signal transmission hole extending from the one end of the plate body to the other end of the plate body, wherein a signal transmission part is disposed in the signal transmission hole, and configured to transmit a first signal between the first circuit board and the second circuit board; at least one ground hole disposed at a spacing to the signal transmission hole and extending from the one end of the plate body to the other end of the plate body, wherein a ground part is disposed in the at least one ground hole, and is configured to connect a ground of the first circuit board and a ground of the second circuit board.

2. The electronic device according to claim 1, wherein the first component comprises at least one of the following: a radio frequency integrated circuit, a power amplifier, a filter, a central processing unit, or a system on chip; and the second component comprises at least one of the following: a radio frequency integrated circuit, a power amplifier, a filter, a central processing unit, or a system on chip.

3. The electronic device according to claim 1, wherein the first signal is a radio frequency signal, wherein the radio frequency signal comprises a Wireless-Fidelity signal, a Bluetooth signal, a Global Navigation Satellite System signal, a 2G signal, a 3G signal, a 4G signal, or a 5G signal.

4. The electronic device according to claim 1, wherein the plate body further comprises:

a connection hole located on a side that is proximate to the at least one ground hole and that is away from the signal transmission hole, wherein a connection part is disposed in the connection hole, and the connection part is configured to transmit a second signal between the first circuit board and the second circuit board.

5. The electronic device according to claim 4, wherein the second signal comprises a power signal or a ground signal.

6. The electronic device according to claim 1, wherein a number of the at least one ground hole is at least two.

7. The electronic device according to claim 6, wherein the number of the at least one ground hole is 4, 6, or 8.

8. The electronic device according to claim 1, wherein the at least one ground hole comprises four ground holes, a cross-sectional shape of each of the four ground holes comprising a first area and a second area, wherein the first area is perpendicularly connected to the second area, the cross-sectional shape of the ground hole comprises an inner side edge and an outer side edge that are opposite to each other, and the signal transmission hole is located on a side that is proximate to the inner side edge and that is away from the outer side edge.

9. The electronic device according to claim 1, wherein a cross-sectional shape of the signal transmission hole is a circle, an ellipse, or a polygon, and the cross-sectional shape of the at least one ground hole is a circle, an ellipse, or a polygon.

10. The electronic device according to claim 1, wherein a cross-sectional shape of the at least one ground hole is the same as the cross-sectional shape of the signal transmission hole.

11. The electronic device according to claim 6, wherein the two ground holes are arranged with an equal distance therebetween in a circumference direction of the signal transmission hole.

12. The electronic device according to claim 11, wherein a distance between adjacent ground holes is d, wherein $d \leq \lambda/n$; the signal transmission part is configured to transmit a signal having a highest frequency f; and a wavelength $\lambda$ corresponding to the highest frequency f, and $n \geq 4$.

13. The electronic device according to claim 12, wherein n=10.

14. The electronic device according to claim 1, wherein a number of the at last one ground hole is 1, and a cross-sectional shape of the ground hole is a closed ring.

15. The electronic device according to claim 14, wherein the cross-sectional shape of the signal transmission hole is a circle, an ellipse, or a polygon.

16. The electronic device according to claim 1, wherein the ground part is formed by filling the at least one ground hole with a first conductive material, and the signal transmission part is formed by filling the signal transmission hole with a second conductive material.

17. The electronic device according to claim 16, wherein the first conductive material is the same as the second conductive material.

18. The electronic device according to claim 1, wherein a radius of the signal transmission hole is determined according to a characteristic impedance of the signal transmission part.

19. The electronic device according to claim 1, wherein a radius of a circle contour that is tangent to each ground part and that is between the signal transmission part and the ground part is determined according to characteristic impedance of the signal transmission part.

20. The electronic device according to claim 1, wherein a first welding area is disposed on a first side that is of the first circuit board and that faces the second circuit board, a second welding area is disposed on a second side that is of the second circuit board and that faces the first circuit board, the one end of the plate body abuts against the first welding area, and the other end of the plate body abuts against the second welding area; and a first positioning piece is disposed on the first side, wherein the first positioning piece is located on an outer side of the first welding area.

* * * * *